United States Patent [19]
Kimoto et al.

[11] Patent Number: 5,210,431
[45] Date of Patent: May 11, 1993

[54] OHMIC CONNECTION ELECTRODES FOR P-TYPE SEMICONDUCTOR DIAMONDS

[75] Inventors: Tunenobu Kimoto; Tadashi Tomikawa; Shoji Nakagama; Masayuki Ishii; Nobuhiko Fujita, all of Itami, Japan

[73] Assignee: Sumitomo Electric Industries, Ltd., Osaka, Japan

[21] Appl. No.: 831,651

[22] Filed: Feb. 7, 1992

Related U.S. Application Data

[63] Continuation of Ser. No. 548,690, Jul. 6, 1990.

[30] Foreign Application Priority Data

Jul. 6, 1989 [JP] Japan .................. 1-174373

[51] Int. Cl.$^5$ .................. H01L 23/48; H01L 23/40
[52] U.S. Cl. .................. 257/77; 257/607; 257/742; 257/761; 257/765; 257/766; 257/769; 257/777
[58] Field of Search .............. 357/95, 61, 63; 257/77, 257/607, 742, 761, 765, 766, 769, 777

[56] References Cited

U.S. PATENT DOCUMENTS 2,829,993  4/1958  Myer et al. .................. 357/65

OTHER PUBLICATIONS

Sze, S. M. *Physics of Semiconductor Devices*, 2nd ed., John Wiley, 1981, pp. 304–306.
K. L. Moazed et al, "Ohmic Contacts to Semiconducting Diamond" IEEE Electron Device Letters, Jul. 1988, No. 7 New York, NY, pp. 350–351.

*Primary Examiner*—Edward Wojciechowicz
*Assistant Examiner*—Sara W. Crane
*Attorney, Agent, or Firm*—Cushman, Darby & Cushman

[57] ABSTRACT

In an ohmic contact electrode for the p-type semiconductor diamond, the electrode is formed of metals or metallic compounds containing boron on a p-type semiconductor diamond, so as to obtain a decreased contact resistance.

3 Claims, 2 Drawing Sheets

OHMIC CONNECTION ELECTRODES FOR P-TYPE SEMICONDUCTOR DIAMONDS This is a continuation of application Ser. No. 07/548,690, filed on Jul. 6, 1990.

BACKGROUND OF THE INVENTION

1. Filed of the Invention

This invention relates to ohmic connection electrodes for p-type semiconductor diamonds.

2. Description of the Prior Art

The semiconductor diamond is now drawing industrial attention as a new material for semiconductor devices such as diodes, transistors, sensors, or the like.

Although the diamond is widely known as an insulating substance, the one discussed herein is a semiconductor diamond having low resistivity.

The diamond has broad forbidden band width (5.5 eV) as well as a large mobility of carriers (2000 $cm^2$/Vs), and is stable thermally and chemically.

For these reasons, the semiconductor diamond is keenly expected as a material for environmentally withstanding, high-speed power-use devices or blue light emitting elements.

The semiconductor diamond is available in the forms of a natural bulk, high-pressure synthetic bulk, and vapor-phase synthetic film.

The p-type diamond can be obtained by doping boron (B).

On the other hand, the n-type diamond, though it may be obtained by doping phosphorus (P) and lithium (Li), has a high resistivity. And an n-type diamond with a low resistivity has not yet been developed.

Although bipolar devices are not involved, the devices that have already come out in prototypes on the basis of the semiconductor diamond include at present Schottky diodes, making use of Schottky junction with tungsten (W) and a p-type diamond, and several types of unipolar transistors.

In manufacturing semiconductor devices, it is extremely important to form such electrodes that allow ohmic connection. The ohmic connection electrode is an electrode with current-voltage characteristics which are symmetric between the forward and backward directions in accordance with the Ohm's law. Moreover, it is preferable that the contact resistance thereof be as low as possible, where the contact resistance is defined as a voltage applied to make a unit current flow through a unit contact surface. The unit thereof is $\Omega cm^2$.

It is common knowledge that an electrode capable of ohmic connection can be obtained by forming some metals such as Ti, AuTi, and AuTa through the method of metallizing on a p-type diamond.

The technique of forming ohmic connections is an important technique in manufacturing semiconductor devices.

However, the ohmic connections now available to semiconductor diamonds using Ti, AuTa, and the like involve a large contact resistance as much as more than 1 $\Omega cm^2$.

In any device manufactured using the conventional ohmic connection with the semiconductor diamond, even if a voltage is applied to it, there occurs a remarkable voltage drop across such an ohmic connection electrode. This results in a drop of an effective voltage applied to the device, whereby good characteristics of the semiconductor diamond connection can not be sufficiently utilized. Furthermore, the device suffers from a serious drawback that heat is generated at an ohmic connection electrode.

In manufacturing any electronic devices, contact resistances less than $10^{-4} \Omega cm^2$ are required for that of ohmic connections, and far lower contact resistances are demanded for high-speed, high-frequency devices.

To enable the semiconductor diamond to be utilized as a material for semiconductor devices, a low-resistance ohmic connection is essential.

SUMMARY OF THE INVENTION

An essential object of the present invention is therefore to provide a p-type semiconductor diamond ohmic connection electrode having a low contact resistance.

In order to accomplish the above object, there is provided an ohmic connection electrode for the p-type semiconductor diamond in accordance with this invention such that the electrode is formed of metals or metallic compounds containing boron on a p-type semiconductor diamond.

The primary electrode material for containing boron is selectable from Au, Pt, Al, Ag, Ni, Ti, Ta, Cr, Zr, $TiSi_2$, NiSi, PtSi, or the like.

The diamond may be effectively used in any form of a natural bulk, a high-pressure synthetic bulk, or a vapor-phase synthetic film.

This invention provides an ohmic contact electrode having a low resistance by forming metals or metallic compounds containing boron into electrodes on p-type semiconductor diamonds.

The above features and advantage have been found by the inventors of the present invention through various experiments, it has not yet been clarified why the boron involved therein serves to obtain a low resistance, but it may be deducted as follows.

When a metal or metallic compound containing boron is formed into an electrode on a p-type semiconductor diamond, the boron is activated by the heating of the substrate in forming electrodes. Radiation heat in forming electrodes, the annealing effect after forming electrodes, or the like, causes the boron to diffuse into the diamond.

The boron acts in a diamond as effective acceptors, as is well known to those skilled in the art. The region into which the boron is diffused, therefore, forms a p-type layer (p+ layer) doped to a high-level concentration. Whereas the diamond is originally of a p-type, this causes the diamond to be a p-type semiconductor having a much higher concentration than the original average one.

As an actual junction between a metal and a semiconductor is in general of the Schottky type, the depletion layer width, d, in the case of p-type semiconductors, is given by the following formula:

$$d = \sqrt{\frac{2\epsilon_s \epsilon_0 (V_a - V)}{eN_a}} \tag{1}$$

Where, $\epsilon_s$ represents the dielectric constant of the semiconductor, $\epsilon_0$ the dielectric constant of vacuum, $\theta$ the elementary quantity of electric charge, $N_a$ the acceptor density of the semiconductor, $V_a$ the diffusion potential, and V the applied voltage.

The band structure in the vicinity of the depletion layer is shown in FIG. 1.

A Fermi level 3 of the semiconductor and a Fermi level 1 of the outer metal lie on a line. The semiconductor includes a conduction band 2 and a valence band 4, where, the semiconductor being of a p-type, the valence band 4 and the Fermi level 3 are close to each other. As the acceptor density gets higher in proximity of boundary 5, the band bends sharply downward. Holes, which are collected in an upward bent portion 6 of the valence band, can go through the barrier into the metal due to the tunneling effect.

All the acceptors in the boundary between the metal and semiconductor capture electrons, being negatively charged to $\theta$. Such acceptors are distributed almost uniformly in the proximity of the boundary and hence the Gauss' equation for electric fields and charges can be integrated into formula (1).

As is apparent from formula (1), the higher the acceptor density of the semiconductor, the less the depletion layer width d.

Therefore, when a p+ layer is formed on the diamond surface by the diffusion of boron, as in the method of electrode formation of this invention, the depletion layer is remarkably thinned. For this reason, the holes can pass through the depletion layer due to the tunneling effect without jumping over the barrier existing in the interface between the metal or metallic compound and the diamond.

The contact between the metal or metallic compound and the diamond is accompanied by a low resistance due to the fact that the holes can easily pass through the thin depletion layer.

This invention makes it possible to form an ohmic contact having a low contact resistance on a p-type semiconductor diamond with the aid of the aforementioned mechanism.

DETAILED DESCRIPTION OF THE PREFERRED EMBODIMENTS

Embodiment 1

Now the method of electrode formation in accordance with the invention will be described more specifically by way of embodiments thereof.

Examination of which types of diamonds this invention is effective for, electrodes in accordance with the method of the present invention were formed on the following three types of diamonds, then the contact resistances and ohmic characteristics of the respective electrodes were measured. a: Natural $II_b$ type of diamond (P-type with B doped.) b: High-pressure synthetic $II_b$ type of diamond c: B~doped p-type film type of diamond subjected to a homo-epitaxial growth in the way of vapor-phase synthesis on a high-pressure synthetic $I_b$ type of diamond, e.g. the vapor-phase synthetic film was formed using $CH_4$, $H_2$, and $B_2H_6$ gases by the microwave plasma CVD method.

The electrodes were formed by vacuum evaporation or sputtering method.

Figure 1:
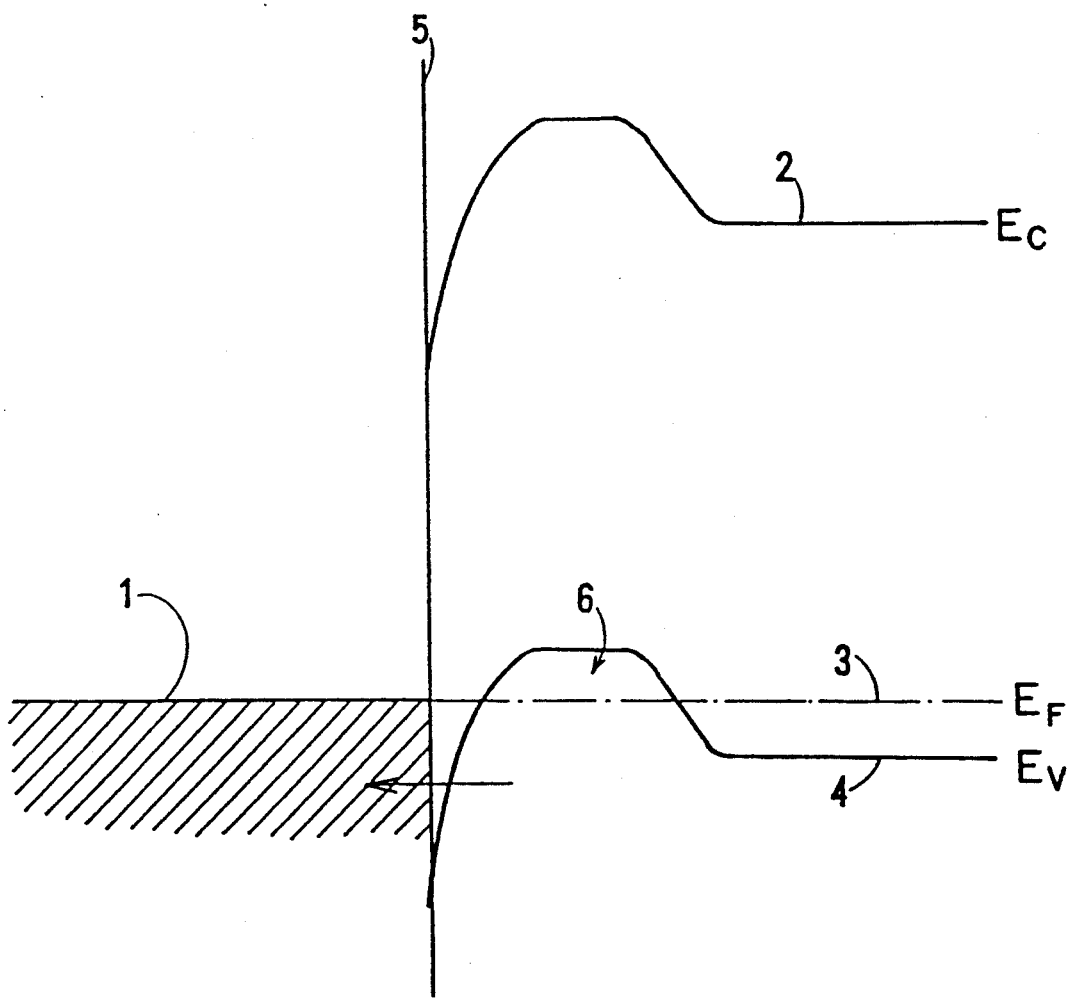
FIG. 1 is a schematic diagram showing the band structure of the semiconductor and diamond when electrodes are formed of metals or metallic compounds containing boron on a p-type semiconductor diamond.
Figure 2:
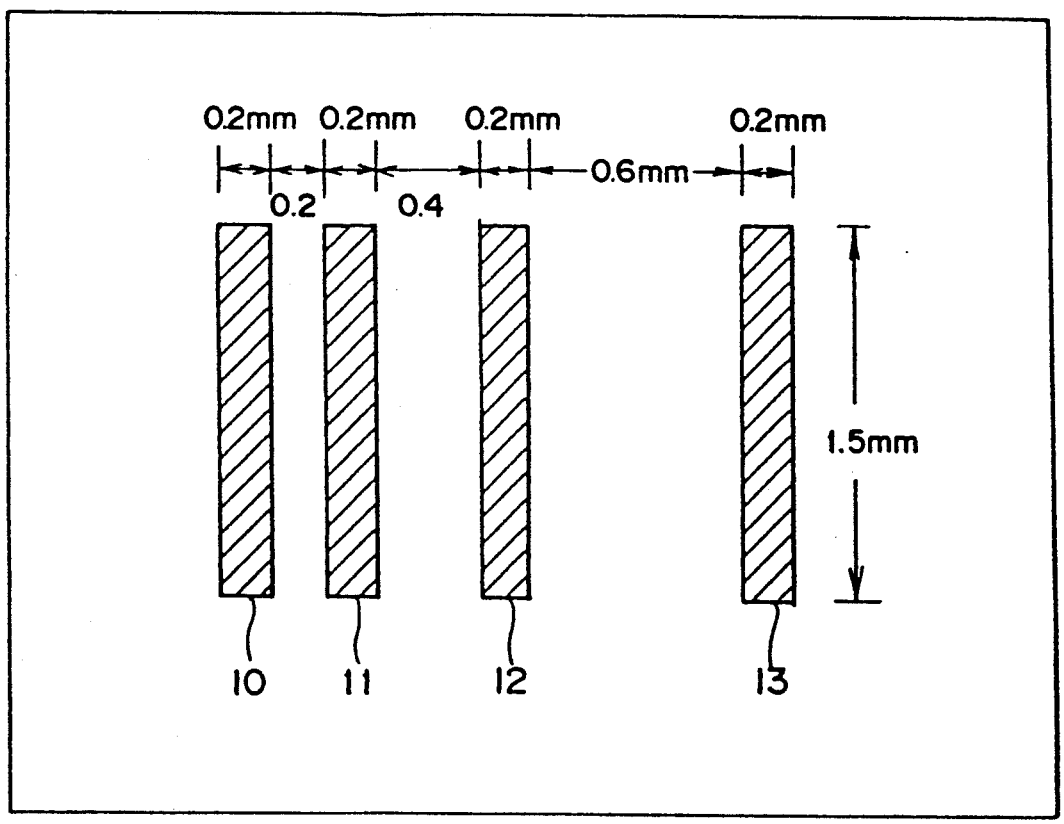
FIG. 2 is a plan view of the electrode patterns used in the embodiments of the present invention to determine the contact resistance between the semiconductor diamond and electrodes, where the shaded portions show the electrodes.

On this experiment, the electrode patterns as shown in FIG. 2 were formed on the diamonds using a metal mask. Four electrodes 10, 11, 12 and 13 were formed, each one 1.5 mm long by 0.2 mm wide, in parallel with each other and spaced at the intervals of 0.2 mm, 0.4 mm and 0.6 mm.

The ohmic characteristics of the electrodes were measured and decided from the current-voltage characteristics between adjacent electrodes out of the four electrodes for a voltage range of $-10$ to $+10$ V. The contact resistances of the electrodes were determined using Transmission Line Model based on the resistances between two adjacent electrodes as shown in FIG. 2 and the electrode intervals thereof.

Table 1 lists the results from Embodiment 1.

TABLE 1

| Types of Diamonds vs. Contact Resistance of Electrodes Electrode: AuB (B: 0.5%) | | | | |
|---|---|---|---|---|
| Type | Natural | High-pressure synthetic | Vapor-phase synthetic | Vapor-phase synthetic |
| Diamond | | | | |
| Conduction type | P | P | P | P |
| Resistivity ($\Omega$cm) | $2 \times 10^2$ | $5 \times 10$ | $2 \times 10^2$ | $3 \times 10^{-1}$ |
| Thickness ($\mu$m) | 500 | 500 | 2 | 2 |
| Current-voltage characteristics | Ohmic | Ohmic | Ohmic | Ohmic |
| Contact resistance ($\Omega$cm$^2$) | $8 \times 10^{-3}$ | $6 \times 10^{-4}$ | $7 \times 10^{-4}$ | $3 \times 10^{-5}$ |

The three types of diamonds previously described were used here. The electrodes were formed by a vacuum evaporation method at a substrate temperature of 400° C. using AuB containing 0.5% of B, where the thickness of the AuB was approximately 0.2 to 0.3 $\mu$m.

As is understood from the Table 1, the AuB has proved to be ohmic to any one of the three types of diamonds, wherein the contact resistances thereof have resulted in values of the order of $10^{-3}$ to $10^{-5}$ $\Omega$cm$^2$, 2 to 5 orders of magnitude lower than their conventional counterparts.

It may be effective to add, annealing to an adequate degree after the electrodes are formed. Although the temperature and time duration for annealing differ in their optimum values depending on the electrode materials used, a temperature of approximately a few hundred C° to 1000° C. is required.

In the case where the temperature exceeds over 600° C., however, it is desirable to carry out the annealing in inert gas, $N_2$, $H_2$, or vacuum owing to that the presence of $O_2$ causes oxidation or graphitization of a diamond to be easily progressed.

Instead of the annealing, it is also effective to increase temperature to an adequate degree during forming of the electrodes.

Embodiment 2

This invention is characterized by using metals or metallic compounds containing B for electrodes. Suitable concentrations of B were examined. With the electrodes made of AuB, the contact resistances thereof were measured with various concentrations of B. The results of the measurement are shown in Table 2.

TABLE 2

Concentration of Boron (B) vs. Contact Resistances of Electrodes

| Concentration of B in AuB (%) | Contact Resistance ($\Omega cm^2$) |
| --- | --- |
| 0.01 at | $6 \times 10^{-3}$ |
| 0.1 at | $3 \times 10^{-4}$ |
| 0.5 at | $2 \times 10^{-5}$ |
| 1.0 at | $2 \times 10^{-5}$ |
| 5.0 at | $8 \times 10^{-5}$ |
| 10.0 at | $5 \times 10^{-4}$ |

The diamond used here in a p-type diamond of the vapor-phase synthetic type having a resistivity of approximately 50 $\Omega$cm, and a thickness of 2 $\mu$m. The AuB was formed by the vacuum evaporation method without heating the substrate, and subjected to an annealing at 800° C. for five minutes in an atmosphere of $N_2 + H_2$ ($H_2$:10%).

It is understood from the Table 2 that the contact resistance is first decreased with the increasing of concentration of B and reaches a minimum value at a concentration of B of approximately 1%, thereafter in turn being increased. In this case, if the concentration of B involved become excessively high, the resistance of the electrode itself is increased, thus being undesirable. A value of the concentration of B of 0.1% or so is practically sufficient as a material of the electrodes.

Embodiment 3

To see which materials are suitable for the electrodes, a number of the electrodes are shown in FIG. 2 which were prepared using various materials of which the contact resistances of electrodes were measured.

The primary components of the electrode materials were metals and metallic silicides, i.e. specifically Au, Pt, Al, Ag, Ni, Ta, Cr, Zr, $TiSi_2$, NiSi, and PtSi, whereto boron (B) was added.

The electrodes here were made by vacuum evaporation or sputtering depending on the kinds of the material used.

The diamond used was a vapor-phase synthetic p-type diamond like Embodiment 2.

The concentration of B used within the electrode materials was in a range of 0.1 to 0.5%.

The results of the measurement for various electrode materials are shown in Table 3.

The measurements were performed with different types of simple-substance metals, alloys, silicides, and so forth, all the materials showed ohmic contacts with low contact resistance. The above result proves the tunneling effect of the holes, as mentioned previously, due to the generation of high-concentration acceptors in the boundary of the metal semiconductor.

TABLE 3

Electrode Materials vs. Contact Resistances

| Electrodes | | Contact |
| --- | --- | --- |
| Material | Formation method | resistance ($\Omega cm^2$) |
| AuB | Vacuum evaporation | $3 \times 10^{-5}$ |
| PtB | Vacuum evaporation | $2 \times 10^{-5}$ |
| AlB | Vacuum evaporation | $1 \times 10^{-4}$ |
| AgB | Vacuum evaporation | $2 \times 10^{-4}$ |
| NiB | Vacuum evaporation | $5 \times 10^{-5}$ |
| TiB | Vacuum evaporation | $2 \times 10^{-5}$ |
| TaB | Vacuum evaporation | $3 \times 10^{-5}$ |
| CrB | Vacuum evaporation | $1 \times 10^{-4}$ |
| ZrB | Vacuum evaporation | $7 \times 10^{-5}$ |
| $TiSi_2B$ | Sputtering | $3 \times 10^{-5}$ |
| NiSiB | Sputtering | $4 \times 10^{-5}$ |
| PtSiB | Sputtering | $2 \times 10^{-5}$ |

As described hereinabove, it is possible to obtain an ohmic contact with low contact resistance by forming electrodes out of metals or metallic compounds containing boron on a semiconductor diamond.

The art of forming the contact electrodes is indispensable in manufacturing semiconductor diamond devices and therefore the electrodes according to the present invention are effective in forming any types of electronic device.

What is claimed is:

1. An ohmic contact electrode for a p-type semiconductor consisting essentially of:
    a p-type semiconductor diamond substrate; and
    a metal or metallic compound selected from the group consisting of: Au, Pt, Al, Ag, Ni, Ta, Cs, Zr, $TiSi_2$, and containing at least 0.01% and not more than 10% boron formed on said substrate.

2. The electrode according to claim 1, wherein annealing or forming of the electrode is carried out at 300° to 1000° C.

3. The electrode according to claim 2, wherein the forming or annealing of the electrode is carried out at 600° to 1000° C. in a non-oxidizing atmosphere.

* * * * *